(12) United States Patent
Hara

(10) Patent No.: US 6,507,051 B1
(45) Date of Patent: Jan. 14, 2003

(54) SEMICONDUCTOR INTEGRATED CIRCUIT DEVICE

(75) Inventor: Naoki Hara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 2 days.

(21) Appl. No.: 09/639,096

(22) Filed: Aug. 16, 2000

(30) Foreign Application Priority Data

Aug. 19, 1999 (JP) .......................................... 11-233200

(51) Int. Cl.[7] .................. H01L 31/0328; H01L 31/0336
(52) U.S. Cl. ....................... 257/194; 257/192; 257/195; 257/402; 257/409; 438/167; 438/172; 438/176
(58) Field of Search ................................ 257/192, 194, 257/402, 409, 20, 24, 27, 195, 197, 198, 12, 14; 438/167, 172, 176, 285, 596, 235, 307, 312

(56) References Cited

FOREIGN PATENT DOCUMENTS

JP           404125973 A    *   4/1992

* cited by examiner

Primary Examiner—Steven Loke
Assistant Examiner—Donghee Kang
(74) Attorney, Agent, or Firm—Armstrong, Westerman & Hattori, LLP

(57) ABSTRACT

A semiconductor device includes a semiconductor layer structure, and gate, drain and source electrodes provided on the semiconductor layer structure, the gate electrode being located between the drain and source electrodes. A depletion modulating part is located between the gate electrode and the drain electrode and includes portions spaced apart from each other in a gate-width direction.

2 Claims, 7 Drawing Sheets

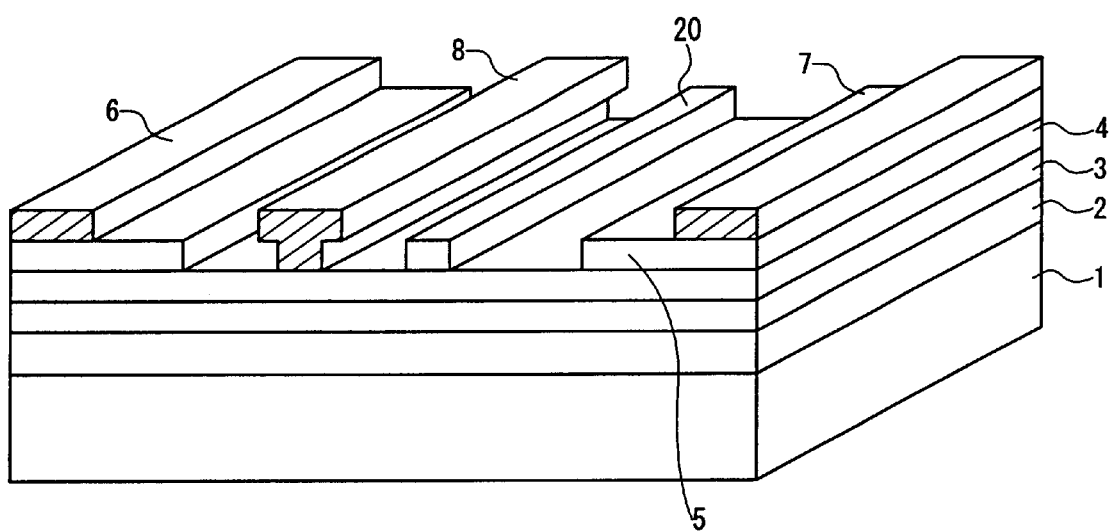
F I G. 1 3

SEMICONDUCTOR INTEGRATED CIRCUIT DEVICE

BACKGROUND OF THE INVENTION

1. Field of the Invention

The present invention relates to semiconductor integrated circuit devices including field-effect transistors, and more particularly to an integrated high-breakdown-voltage compound semiconductor field effect transistor.

2. Description of the Related Art

A compound semiconductor field effect transistor (FET) is known as a high-frequency device. Typically, such a compound semiconductor FET is a high electron mobility field effect transistor (HEMT) and a Schottky gate type field effect transistor (MESFET). When the FETs as described above are used as power devices, these FETs are required to have a high breakdown voltage. One of the factors involved in the breakdown voltage of the FETs is a phenomenon in which the electric field is locally raised in a portion of the gate electrode close to the drain end (generally, the above is called electric field concentration). Particularly, in the ON state, the electric field exceeds the critical value which causes impact ionization at the drain end of a depletion layer extending from the gate electrode, so that an Avalanche breakdown is caused.

As means for relaxing the electric field concentration, there are known a dual-gate structure and a groove which is formed between the gate and drain. In any means, the depletion layer or the groove extends in the depth direction from the surface between the gate and the drain. This arrangement narrows the current path through which the drain current flows and increases the voltage drop developing across the narrowed current path. This decreases the potential of the gate electrode at the drain end. Consequently, the electric field intensity is lowered.

The dual-gate structure has the following disadvantages. The depletion layer in the dual-gate structure has a larger capacitance than that of the single-gate structure because the dual-gate structure has two gates. An increase in the capacitance of the depletion layer increases parasitic capacitance and thus degrades the high-frequency characteristics.

The use of the groove formed between the gate and the drain increases the ON resistance because of the narrowed current path below the groove and thus reduces the gain.

As described above, the conventional high-frequency compound semiconductor field effect transistors, which are typically HEMT and MESFET, do not have good high-frequency characteristics because of the arrangement directed to avoiding the electric field concentration and obtaining an increased breakdown voltage. In other words, the conventional FETs do not realize the high-breakdown voltage and the good high-frequency characteristics simultaneously.

SUMMARY OF THE INVENTION

It is a general object of the present invention to provide a semiconductor integrated circuit device in which the above-mentioned disadvantages are eliminated.

A more specific object of the present invention is to provide a semiconductor integrated circuit device which has an improved the high-breakdown voltage and an improved high-frequency characteristics.

The above objects of the present invention are achieved by a semiconductor device comprising: a semiconductor layer structure; gate, drain and source electrodes being provided on the semiconductor layer structure, the gate electrode being located between the drain and source electrodes; and a depletion modulating part that is located between the gate electrode and the drain electrode and includes portions spaced apart from each other in a gate-width direction.

The above objects of the present invention are also achieved by a semiconductor device comprising: cap layers that make ohmic contacts with a source electrode and a drain electrode and defines a gate recess; a gate electrode in the gate recess; and a continuous layer that is provided on a semiconductor surface between the gate electrode and one of the cap layers which makes an ohmic contact with the drain electrode, the continuous layer being electrically conductible with respect to the semiconductor surface and continuously extending in a gate width direction.

BRIEF DESCRIPTION OF THE DRAWINGS

Other objects, features and advantages of the present invention will become more apparent from the following detailed description when read in conjunction with the accompanying drawings, in which:

FIG. 13 is a cross-sectional and perspective view of an eleventh embodiment of the present invention.

DESCRIPTION OF THE PREFERRED EMBODIMENTS

A description will be given of the principle of the present invention.

The depletion layer modulating part of the invention performs a modulating operation in such a way as to deform the depletion layer originally formed between the gate electrode and the drain electrode or create newly depletion layers in addition to the original depletion layer. The modulation scatters the carriers forming a drain current or causes the carriers to pass through channels or current paths narrowed due to the portions of the depletion layer modulating part, these portions being arranged in line at intervals. Thus, the modulation causes and increases the voltage drop in the position of the depletion layer modulating part, whereby the strength of the electric field in the vicinity of the gate electrode can be reduced and the Avalanche breakdown voltage can be increased.

The depletion layer modulating part of the invention does not narrow the current paths as greatly as the conventional dual-gate structure, so that the high-frequency characteristic is little degraded.

Now, a description will be given of various embodiments of the present invention with reference to the accompanying drawings.

[First Embodiment]

Figure 1:
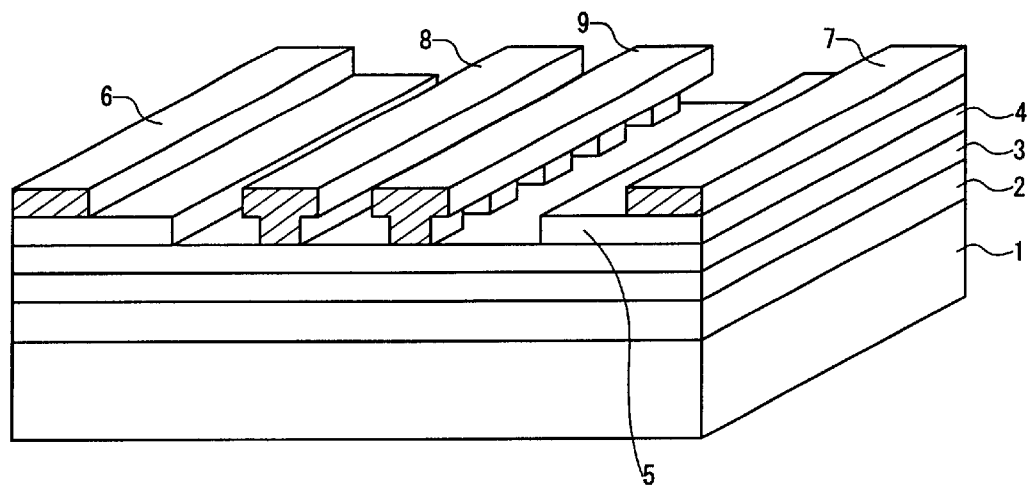
FIG. 1 is a cross-sectional and perspective view of a first embodiment of the present invention.

FIG. 1 is a cross-sectional and perspective view of a high electron mobility field effect transistor (HEMT) having a "second gate" according to a first embodiment of the present invention.

On the entire element area of a semi-insulating gallium arsenate (GaAs) substrate 1, layered are a buffer layer 2 of i-AlGaAs, a channel layer 3 of undoped indium gallium arsenate (n-InGaAs), and a carrier supply layer 4 of n-type aluminum gallium arsenate (n-AlGaAs) in this order. Further, a cap layer 5 of n-type gallium arsenate (n-GaAs), which is patterned so as to correspond to a source electrode 6 and a drain electrode 7, is provided on the above-mentioned stacked structure. The cap layer 5 ohmic-contacts the source electrode 6 and the drain electrode 7. A gate electrode 8, and a second gate electrode 9 located between the source and the drain are formed on the carrier supply layer 4. The contact surface of the second gate electrode 9 that contacts the carrier supply layer 4 is formed so as to be discontinuous in the gate-width direction. This discontinuous contact surface of the second gate electrode 9 is quite different from that the contact surface in the second gate electrode in the conventional dual-gate structure.

The discontinuous contact surface of the second gate electrode 9 which interfaces with the semiconductor layer contributes to relaxing the electric field concentration as in the case of the HEMT using the second continuous gate electrode. In addition, the depletion layer is not completely spread below the second gate electrode 9, whereby a sufficiently low gate capacitance can be ensured. In this regard, the HEMT of the first embodiment of the present invention is superior to the HEMT using the second continuous gate electrode. At the interface between the second gate electrode 9 and the carrier supply layer 4, it is required that the energy band is discontinuous. For example, in the case of the Schottky junction, the second gate electrode 9 is made of aluminum (Al). When a semiconductor is used to form the second gate electrode 9, it is made of aluminum gallium arsenate ($Al_xGaAs$). In this case, the composition ratio x of aluminum may be made higher than the composition ratio y of the carrier supply layer 4 made of ($Al_yGa_{1-y}As$) that contacts the second gate electrode 9. The lower layer portion of the second gate electrode 9 is divided into a plurality of parts, while the upper layer portion thereof is continuous. Hence, it is possible to apply an identical potential to the contact surfaces of the electrode 9 arranged discontinuously in the gate-width direction. The upper layer portion of the second gate electrode 9 may be in a floating state, or may be connected to the gate electrode 8. Also, the second gate electrode 9 may be connected to a signal line arranged within the semiconductor chip or a power supply line. It is also possible to apply an arbitrary potential may externally from the outside of the semiconductor chip. Particularly, it is possible to apply, to the second gate electrode 9, a bias voltage smaller than the bias voltage applied to the gate electrode 8 in order to prevent the depletion layers from extending up to the bottom portion of the channel layer 3.

The depletion layers respectively extending from the portions of the depletion modulating part, namely the second gate electrode 9 are arranged so as to be spaced apart from each other when there is no potential difference among the source, drain and gate electrodes. The depletion layers respectively extending from the portions of the depletion modulating part are arranged so as to partially overlap with the depletion layer extending from the gate electrode 8 when a voltage higher than that applied to the source electrode 6 is applied to the drain electrode 7 and the semiconductor device is in an OFF state.

[Second Embodiment]

Figure 2:
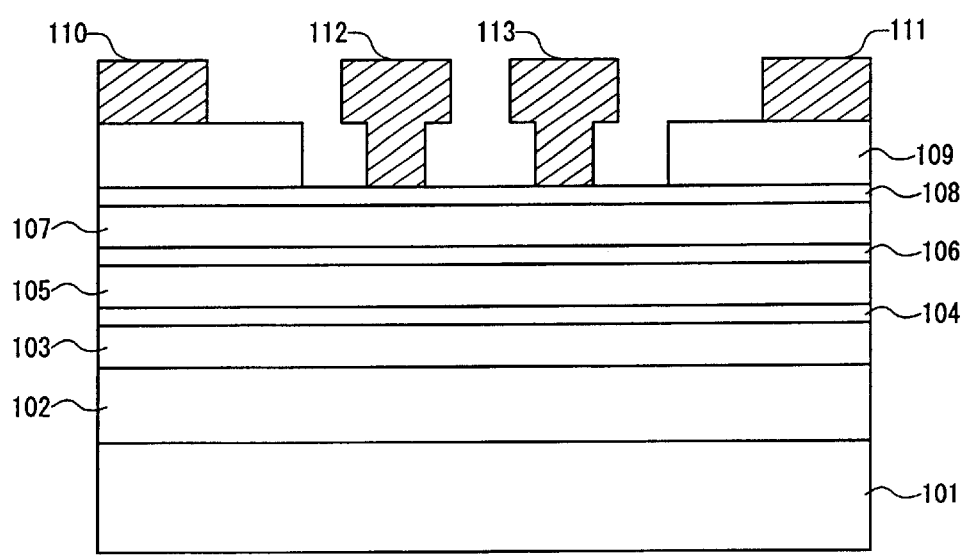
FIG. 2 is a cross-sectional view of a second embodiment of the present invention.

FIG. 2 is a cross-sectional view of a HEMT with the second gate electrode in which the channel layer is sandwiched between two electron supply layers according to a second embodiment of the present invention. Now, a description will be given of a method of fabricating the HEMT according to the second embodiment of the present invention.

By using a metal organic vapor phase epitaxial (MOVPE) method, on a semi-insulating GaAs substrate 101, grown are an i-AlGaAs buffer layer 102 (300 nm, Al composition of 0.25), an n-AlGaAs electron supply layer 103 (5 nm, Al composition of 0.25, $2 \times 10^{18} cm^{-3}$), an i-AlGaAs spacer layer 104 (3 nm Al composition of 0.25), an i-InGaAs channel layer 105 (15 nm, In composition of 0.15), an i-AlGaAs spacer layer 106 (3 nm, Al composition of 0.25), an n-AlGaAs electron supply layer 107 (20 nm, Al composition of 0.25, $2 \times 10^{18} cm^{-3}$), an i-AlGaAs barrier layer 108 (15 nm, Al composition of 0.25), and an n-GaAs cap layer 109 (50 nm, $3 \times 10^{18} cm^{-3}$) in this order. Next, a resist film is formed on the entire surface and is patterned by the lithographic process so as to have openings located in positions in which the source and drain electrodes are to be formed. Then, a source electrode 110 and a drain electrode 111, which ohmic-contact the cap layer 109, are formed by using a vapor deposition (AuGe/Au), liftoff, and the alloy technique. Thereafter, a resist film is formed on the entire surface again, and is patterned so as to have openings located in positions in which a gate recess is to be formed by the lithographic process. Then, the n-GaAs cap layer 109 is selectively removed by an $SiCl_4$-base etching gas, whereby the gate recess is formed.

Then, by using the lithographic process, openings are formed in the resist film which openings are located so as to correspond to the continuous lower layer portion of the gate electrode 8 and the discontinuous lower layer portion of the second gate electrode 9 that is discontinuous in the gate-with direction. Subsequently, aluminum is formed by vapor deposition so as to fill the openings with aluminum. Thereafter, by using the lithographic process again, the aluminum layer is patterned so as to form the upper layer portion of the gate electrode 8 and the upper layer portion of the second gate electrode 9. Finally, the resist films are removed. Thus, the gate electrode 112 and the second gate electrode 113 can be completed. The gate electrode 112 has a slightly overhung structure. The second gate electrode 113 has the lower layer portion that is discontinuous in the gate-width direction, and the upper layer portion that is continuous in the gate-width direction.

The HEMT thus fabricated has an exemplary specification as described below. The gate electrode 112 is 0.15 µm long, and the interval between the gate electrode 112 and the second gate electrode 113 is 0.25 µm. The discontinuous portions of the second gate electrode 113 are arranged in the gate-width direction at an interval of 0.25 µm. In this case, the HEMT has a small-signal gain of 13 dB at a frequency of 30 GHz, and a breakdown voltage of 15 V. Another HEMT which is fabricated in the same manner as described above and which does not have the second gate electrode 113 has a small-signal gain of 13.5 dB and a breakdown voltage of 10 V. Yet another HEMT which is fabricated in the same manner as described above and which has a different, second gate electrode having the continuous lower layer portion has a small-signal gain of 12 dB at the same frequency as described above and a breakdown voltage of 15 V. It can be seen from the above that the HEMT employing the discontinuous second gate electrode 113 has an improved breakdown voltage without greatly decreasing the gain. Another unique arrangement of the HEMT is such that conducting layers forming depletion layer modulating means or all the semiconductor layers are formed on the semiconductor surface.

[Third Embodiment]

Figure 3:
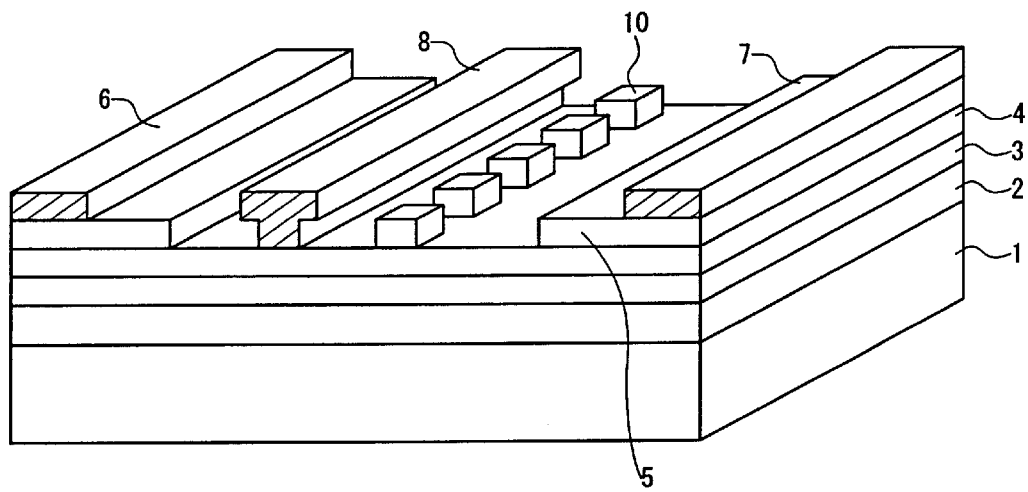
FIG. 3 is a cross-sectional and perspective view of a third embodiment of the present invention.

FIG. 3 is a cross-sectional and perspective view of a HEMT having a discontinuous cap layer according to a third embodiment of the present invention. The HEMT shown in FIG. 3 corresponds to an arrangement in which a discontinuous cap layer remains in the position of the second gate electrode 9 of the HEMT shown in FIG. 1. Even when the external electric field is not applied via the electrode, the depletion layer is repeatedly changed in the gate-width direction and the passage of the carrier is thus influenced. Consequently, the discontinuous cap layer 10 makes it difficult for the Avalanche breakdown to occur.

[Fourth Embodiment]

Figure 4:
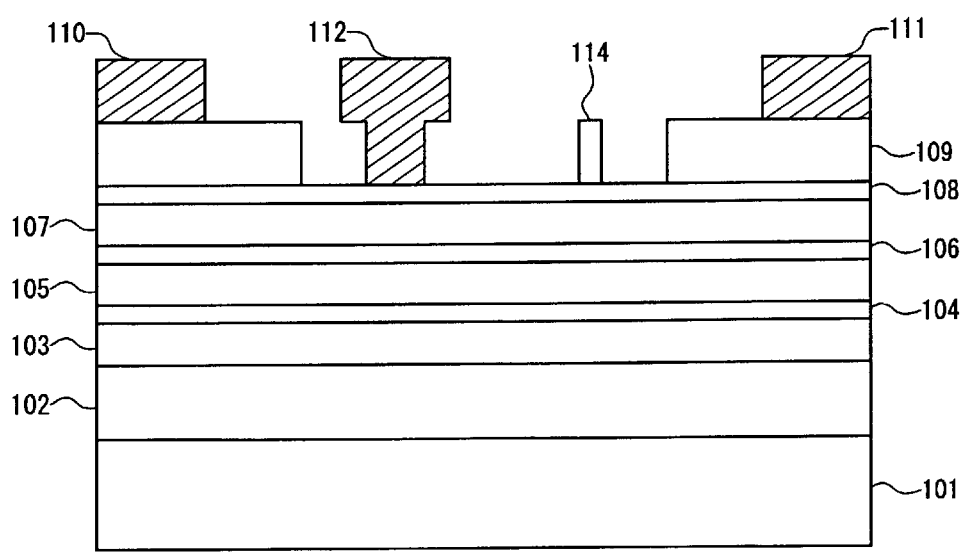
FIG. 4 is a cross-sectional view of a fourth embodiment of the present invention.

FIG. 4 is a cross-sectional view of the HEMT having the discontinuous cap layer and the channel layer that is sandwiched between two electron supply layers. It can be said that the structure shown in FIG. 4 employs a discontinuous cap layer 114 instead of the second gate electrode 113 shown in FIG. 2. The same process as that of the method according to the second embodiment of the present invention using the hetero-junction structure is used up to the formation of the source and drain electrodes. Next, a resist film is formed on the entire surface, and is patterned by the lithographic process so as to form an opening located in a position in which a gate recess is to be formed. At that time, the cap layer 109 is patterned using an $SiCl_4$-system etching gas so that the gate recess is formed while the discontinuous cap layer 10 remains in the gate recess so as to form the discontinuous cap layer 114. Thereafter, another resist film is formed and is patterned so as to have an opening located in a position in which the gate electrode 112 is to be formed. Then, the gate electrode 112 is formed by the vapor deposition (Al) and liftoff technique.

The HEMT thus fabricated has an exemplary specification as described below. The gate electrode 112 is 0.15 $\mu$m long, and the interval between the gate electrode 112 and the discontinuous cap layer 114 is 0.25 $\mu$m. The discontinuous portions of the discontinuous cap layer 114 are arranged at an interval of 0.25 $\mu$m. In this case, the HEMT has a small-signal gain of 12.5 dB at a frequency of 30 GHz, and a breakdown voltage of 15 V. Another HEMT which is fabricated in the same manner as described above and which does not have the discontinuous cap layer 114 has a small-signal gain of 13.5 dB and a breakdown voltage of 10 V. Yet another HEMT which is fabricated in the same manner as described above and which has a continuous cap layer has a small-signal gain of 11 dB at the same frequency as described above and a breakdown voltage of 14 V. It can be seen from the above that the HEMT employing the discontinuous cap layer 114 has an improved breakdown voltage without greatly decreasing the gain.

[Fifth Embodiment]

Figure 5:
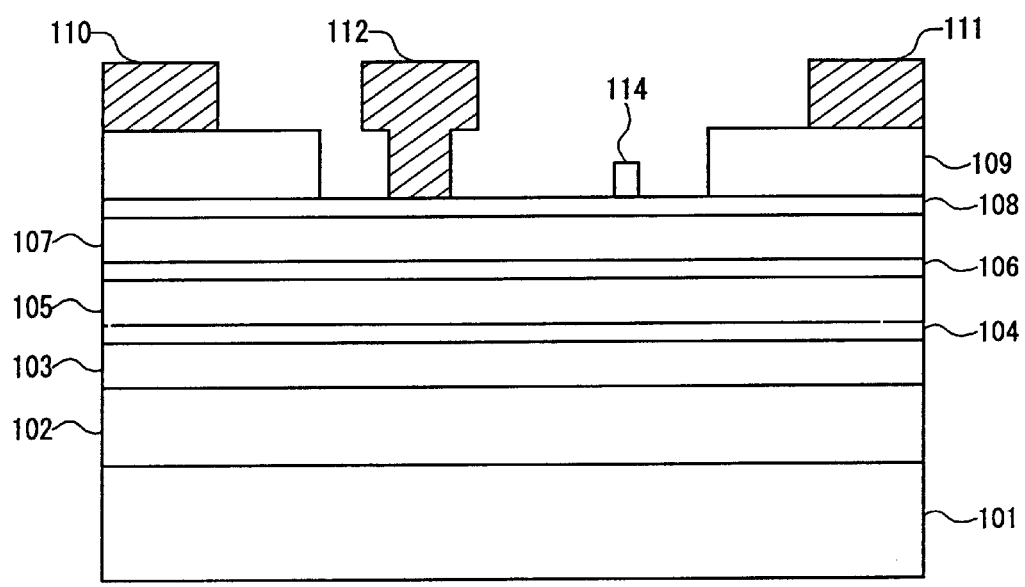
FIG. 5 is a cross-sectional view of a fifth embodiment of the present invention.

FIG. 5 is a cross-sectional view of a HEMT according to a fifth embodiment of the present invention, which has the channel layer sandwiched between two electron supply layers and has the discontinuous cap layer having a different structure as that of the discontinuous cap layer 114 shown in FIG. 4. The discontinuous cap layer 114 used in the fifth embodiment of the present invention has a film thickness equal to half that of the discontinuous cap layer 114 used in the fourth embodiment thereof and is thus equal to 25 nm. The method of fabricating the HEMT shown in FIG. 5 is basically the same as that of fabricating the HEMT shown in FIG. 4. The process up to the formation of the source electrode 110 and the drain electrode 111 in FIG. 5 is the same as that used in FIG. 4. At the time of forming the gate recess, a resist film is formed on the entire surface, and is patterned so as to have an opening located in a position in which the gate recess is to be formed. Then, the cap layer 109 having a thickness of 50 nm is etched by only 25 nm. Next, a resist film is formed on the entire surface again, and is patterned so as to form an opening corresponding to the gate recess to be formed while the portions of the resist film corresponding to the discontinuous portions of the discontinuous cap layer 114 remain. Thereafter, GaAs is etched again, so that the remaining cap layer 104 is removed. The subsequent process is the same as that used in the four embodiment of the present invention.

The HEMT thus fabricated has an exemplary specification as described below. The gate electrode 112 is 0.15 $\mu$m long, and the interval between the gate electrode 112 and the discontinuous cap layer 114 is 0.25 $\mu$m. The discontinuous portions of the discontinuous cap layer 114 are arranged at an interval of 0.25 $\mu$m. In this case, the HEMT has a small-signal gain of 13 dB at a frequency of 30 GHz, and a breakdown voltage of 14 V. Another HEMT which is fabricated in the same manner as described above and which does not have the discontinuous cap layer 114 has a small-signal gain of 13.5 dB and a breakdown voltage of 10 V. Yet another HEMT which is fabricated in the same manner as described above and which has a continuous cap layer has a small-signal gain of 11 dB at the same frequency as described above and a breakdown voltage of 14 V. It can be seen from the above that the HEMT employing the discontinuous cap layer 114 has an improved breakdown voltage without greatly decreasing the gain.

It can be seen from the above that almost the same improvements are available even when the semiconductor layers that electrically conduct to the semiconductor surfaces and are mutually separated are thinner than the thickness of the cap layer. An additional advantage resulting from the reduced thickness of the second gate electrode or the discontinuous cap layer is a reduction in the stray capacitance and an improvement in the high-frequency characteristics.

[Sixth Embodiment]

Figure 6:
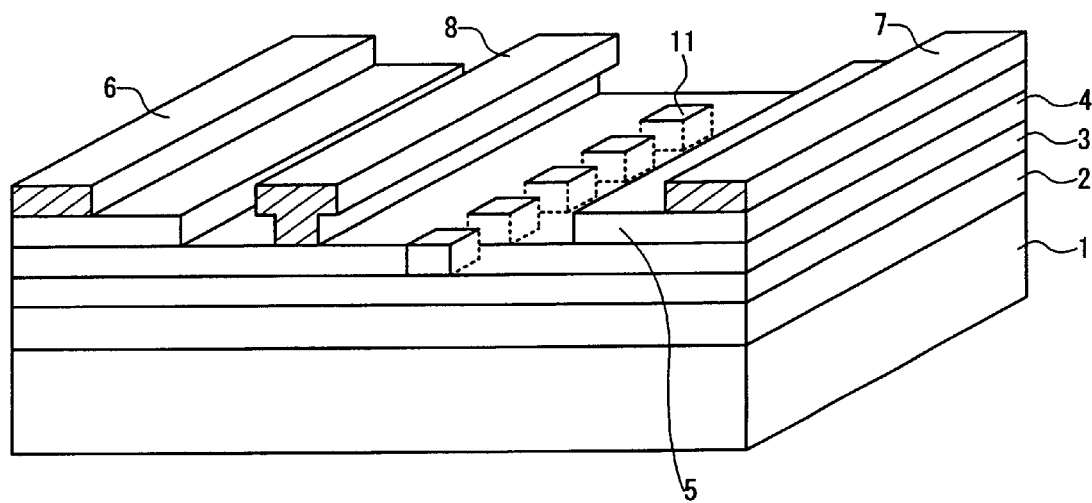
FIG. 6 is a cross-sectional and perspective view of a sixth embodiment of the present invention.

FIG. 6 is a cross-sectional and perspective view of a HEMT according to a sixth embodiment of the present invention in which discontinuous recesses 11 are formed. The discontinuous recesses 11 are used instead of the discontinuous cap layer 10 shown in FIG. 4. More particularly, the discontinuous recesses 11 are formed in the electron supply layer 4 and are located in the position of the discontinuous portions of the cap layer 10. The recess formed in the cap layer 5 between the source electrode 6 and the drain electrode 7 is the first recess, and the discontinuous recesses formed in the electron supply layer 4 are second recesses. When the second recesses 11 are sufficiently deep, the depletion layer extends below the second recesses, so that the breakdown voltage can be increased without no bias. In contrast, when the second recesses 11 are comparatively shallow, the ON resistance can be improved.

[Seventh Embodiment]

Figure 7:
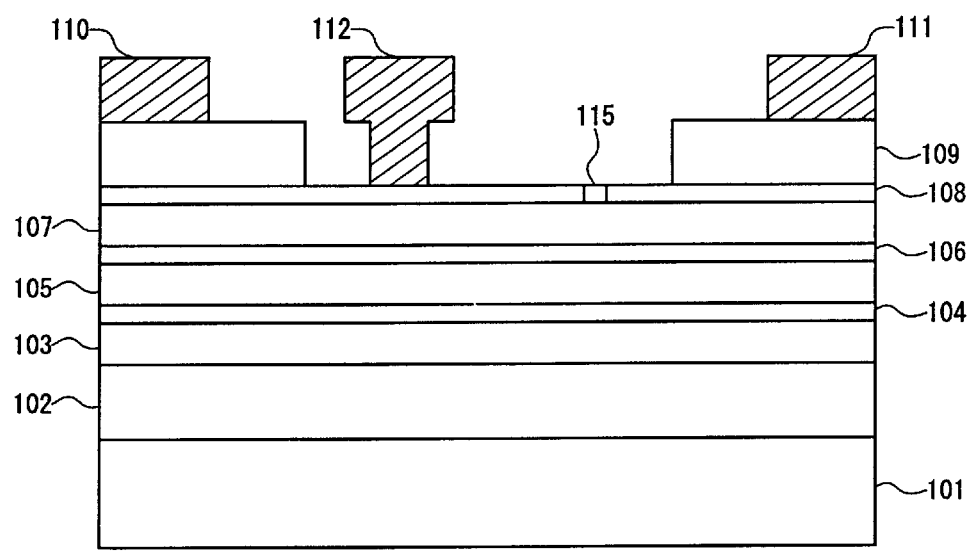
FIG. 7 is a cross-sectional view of a seventh embodiment of the present invention.

FIG. 7 is a cross-sectional view according to a seventh embodiment of the present invention, which employs the second recesses that are arranged intermittently and the channel layer sandwiched between the two electron supply layers. The structure shown in FIG. 7 can be formed by forming the second discontinuous recesses arranged in the gate-width direction. The method of fabricating the HEMT shown in FIG. 7 is basically the same as that of fabricating the HEMT according to the second embodiment of the present invention. The process up to the formation and the source electrode 110 and the drain electrode 111 is the same as that used in the second embodiment of the present invention. Next, by using the lithographic process, an opening is formed in the position in which the gate recess is to be formed. Then, by using an $SiCl_4$-based etching gas, the GaAs cap layer is removed so that the gate recess is formed. Thereafter, by using the lithographic process, openings are formed in the positions in which the second recesses are to be formed. Then, using an HF-based etchant, the AlGaAs barrier layer 108 is etched so that the second recesses 115 arranged intermittently are formed. Then, by using the lithographic process, an opening is formed in the position in which the gate electrode 112 is to be formed. Then, using the vapor deposition (Al) and liftoff technique, the gate electrode 112 is defined.

The HEMT thus fabricated has an exemplary specification as described below. The gate electrode 112 is 0.15 $\mu$m long, and the interval between the gate electrode 112 and the discontinuously arranged recesses 115 is 0.25 $\mu$m. The recesses 115 are arranged at an interval of 0.25 $\mu$m. In this case, the HEMT has a small-signal gain of 13 dB at a frequency of 30 GHz, and a breakdown voltage of 15 V. Another HEMT which is fabricated in the same manner as described above and which does not have the second recesses 115 has a small-signal gain of 13.5 dB and a breakdown voltage of 10 V. Yet another HEMT which is fabricated in the same manner as described above and which has a continuous recess has a small-signal gain of 11 dB at the same frequency as described above and a breakdown voltage of 18 V. It can be seen from the above that the HEMT employing the second recesses 115 has an improved breakdown voltage without greatly decreasing the gain.

[Eighth Embodiment]

Figure 8:
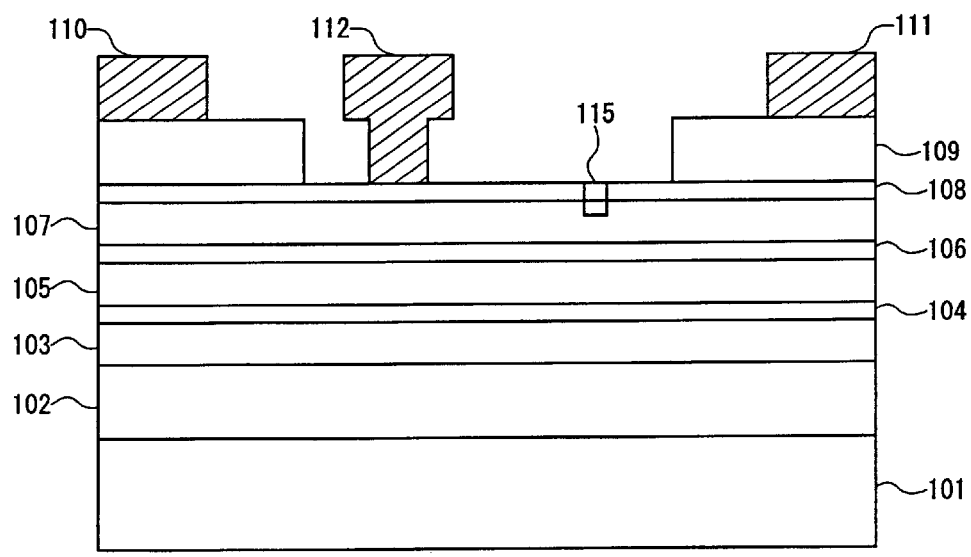
FIG. 8 is a cross-sectional view of an eighth embodiment of the present invention.

FIG. 8 is a cross-sectional view of a HEMT according to an eighth embodiment of the present invention, which employs a different formation of the second recesses 115 and the channel layer sandwiched between the two electron supply layers. The second recesses 115 penetrates through the barrier layer 108 and reaches the electron supply layer 107. The second recesses 115 thus formed are arranged in the discontinuous fashion. The method of fabricating the HEMT shown in FIG. 8 is basically the same as that of fabricating the HEMT shown in FIG. 7. Only the difference in the fabrication method is that the electron supply layer 107 is etched by 5 nm at the time of etching the barrier layer 108 in order to form the second recesses 115.

The HEMT thus fabricated has an exemplary specification as described below. The gate electrode 112 is 0.15 $\mu$m long, and the interval between the gate electrode 112 and the discontinuous cap layer 114 is 0.25 $\mu$m. The discontinuous portions of the discontinuous cap layer 114 are arranged at an interval of 0.25 $\mu$m. In this case, the HEMT has a small-signal gain of 12.5 dB at a frequency of 30 GHz, and a breakdown voltage of 17 V. Another HEMT which is fabricated in the same manner as described above and which does not have the discontinuous cap layer 114 has a small-signal gain of 13.5 dB and a breakdown voltage of 10 V. Yet another HEMT which is fabricated in the same manner as described above and which has a continuous cap layer has a small-signal gain of 10 dB at the same frequency as described above and a breakdown voltage of 20 V. It can be seen from the above that the HEMT employing the discontinuous cap layer 114 has an improved breakdown voltage without greatly decreasing the gain.

[Ninth Embodiment]

Figure 9:
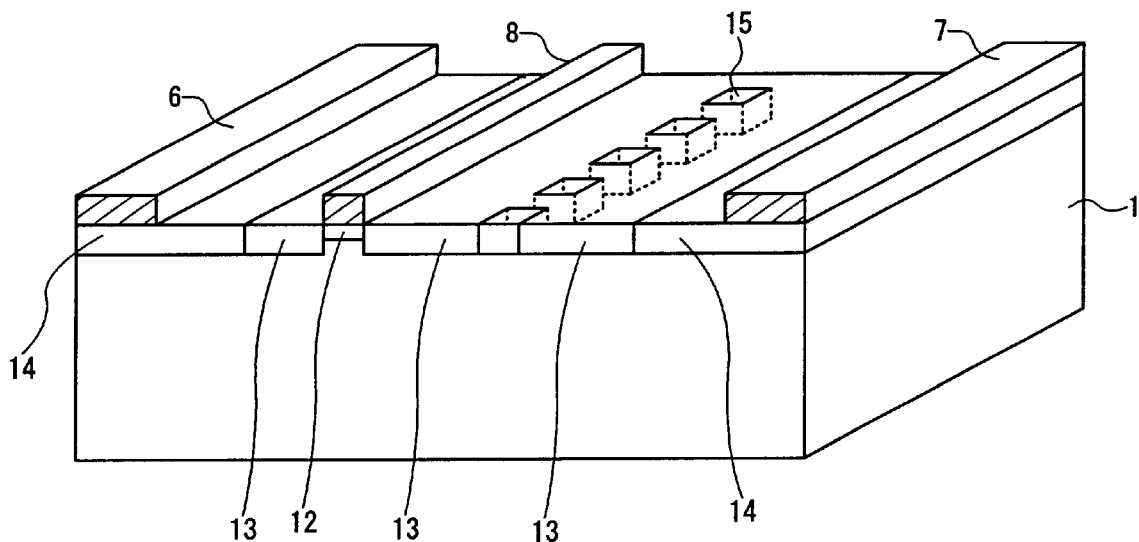
FIG. 9 is a cross-sectional and perspective view of a ninth embodiment of the present invention.

FIG. 9 is a cross-sectional and transparent diagram of a semiconductor device, which has $n^+$-type regions 15 arranged in a discontinuous or intermittent fashion. More particularly, FIG. 9 shows a MESFET having $n^+$-type regions 15 arranged in a discontinuous or intermittent fashion in the gate-width direction. On the surface of the semi-insulating substrate, formed are $n^+$-type source/drain regions 14, $n^-$-type source/drain regions 13, and a channel region 12 interposed therebetween. The source electrode 6 and the drain electrode 7 are formed on the source/drain regions 14. The gate electrode 8 is formed on the channel region 12. One of the features of the MESFET shown in FIG. 9 is that the $n^+$-type regions 15 are aligned intermittently at given intervals. The channel region 12 is in the OFF state when no voltage is applied across the drain electrode 7 and the gate electrode 8. In the OFF state, the depletion region extends up to the bottom of the substrate 1. The $n^-$-type source/drain region 13 located at the drain side acts as a lightly doped drain and already has the effect that relaxes the concentration of the electric field. The $n^+$-type regions 15 aligned discontinuously contributes to further improving the breakdown voltage. It is possible to balance the breakdown voltage and the ON resistance by adequately adjusting the concentration and depth of the $n^+$-type regions 15.

Figure 10:
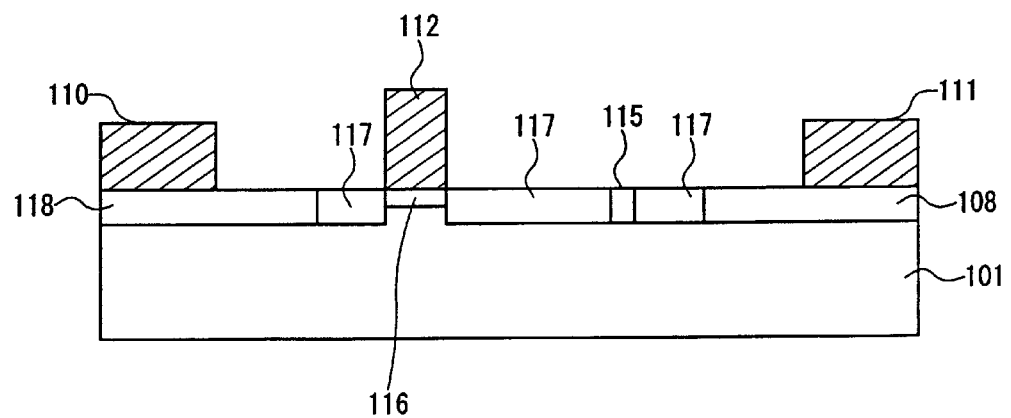
FIG. 10 is a cross-sectional view of a ninth embodiment of the present invention.

FIG. 10 is a cross-sectional view of the MESFET shown in FIG. 9. A description will be given, with reference to FIG. 10, of a method of fabricating the MESFET shown in FIG. 9.

By using the lithographic process, the semi-insulating GaAs substrate 101 is patterned so as to have openings corresponding to only the active regions. Next, Si ions are implanted (40 KeV, $2\times10^{12}$ cm$^{-2}$) as to form, on the entire surfaces of the active regions, an n layer having the same thickness as that of a channel region 116. Then, tungsten silicide (WSi) is deposited to a thickness of 400 nm on the entire surface by sputtering. Thereafter, an opening is formed in the position other than the position in which the gate electrode 8 is to be formed by using the lithographic process. Then, using an $SF_6$-based etching gas, the WSi layer is etched so that the gate electrode 112 can be defined. After that, only the active regions are exposed using the lithographic process, and Si ions are implanted (60 KeV, $2\times10^{13}$ cm$^{-2}$). Thereby, lightly-doped regions 117 that are thicker than the channel region 116 and have comparatively high impurity concentration are formed at both sides of the channel region 116. Then, by using the lithographic process, opened are areas in which ohmic $n^+$-type source/drain regions 118 are to be formed and areas in which $n^+$-type regions 119 aligned discontinuously in the gate-width direction are to be formed. Subsequently, Si ions are implanted (60 KeV, $2\times10^{13}$ cm$^{-2}$). Then, a heat treatment is carried out at 800° C. for 30 seconds in order to activate the implanted Si ions. Thereby, $n^+$-type regions for making good ohmic contacts with the source electrode 110 and the drain electrode 111 are formed in the ohmic n⁺-type source/drain regions 118. Further, the discontinuous n⁺-type regions 119 are formed. Then, by using the lithographic process, the regions in which the source electrode 110 and the drain electrode 111 are to be formed are opened. Thereafter, by using the vapor deposition (AuGe/Au), liftoff, and the alloy technique, the source electrode 110 and the drain electrode 111 are formed.

The MESFET thus fabricated has an exemplary specification as described below. The gate electrode 112 is 0.5 μm long, and the interval between the gate electrode 112 and the discontinuous alignment of the n⁺-type regions 119 is 0.4 μm. The n⁺-type regions 119 are aligned at an interval of 0.4 μm. In this case, the MESFET has a small-signal gain of 10 dB at a frequency of 10 GHz, and a breakdown voltage of 12 V. Another MESFET which is fabricated in the same manner as described above and which does not have the n⁺-type regions 119 has a small-signal gain of 16 dB and a breakdown voltage of 7 V. Yet another MESFET which is fabricated in the same manner as described above and which has a continuous n⁺-type region has a small-signal gain of 13 dB at the same frequency as described above and a breakdown voltage of 10 V. It can be seen from the above that the MESFET employing the n⁺-type regions 119 discontinuously arranged in line has an improved breakdown voltage without greatly decreasing the gain.

When there are regions having an impurity concentration different from that of the peripheral regions in current paths, the depletion layer is distributed in a different manner. In addition, a high-low junction with respect to carriers occurs due to the difference in the built-in potential. The facts will influence a travel of carriers in the primary process of breakdown, so that the breakdown voltage can be improved.

The above-mentioned fabrication process simultaneously form the ohmic n⁺-type source/drain regions 118 and the discontinuous n⁺-type regions 119 by the ion implantation performed only once. Alternatively it is possible to separately form the regions 118 and 119. The regions 118 can be formed by implanting Si ions at 60 KeV and $2\times10^{13}$ cm$^{-2}$. The regions 119 can be formed by implanting Si ions at 60 KeV and $1\times10^{13}$ cm$^{-2}$.

The MESFET thus fabricated has an exemplary specification as described below. The gate electrode 112 is 0.5 μm long, and the interval between the gate electrode 112 and the discontinuous alignment of the n⁺-type regions 119 is 0.4 μm. The n⁺-type regions 119 are aligned at an interval of 0.4 μm. In this case, the MESFET has a small-signal gain of 15 dB at a frequency of 10 GHz, and a breakdown voltage of 10 V. Another MESFET which is fabricated in the same manner as described above and which does not have the n⁺-type regions 119 has a small-signal gain of 16 dB and a breakdown voltage of 7 V. Yet another MESFET which is fabricated in the same manner as described above and which has a continuous n⁺-type region has a small-signal gain of 14 dB at the same frequency as described above and a breakdown voltage of 10 V. It can be seen from the above that the MESFET employing the n⁺-type regions 119 discontinuously arranged in line has an improved breakdown voltage without greatly decreasing the gain. It is possible to balance the gain and the breakdown voltage by changing the concentration of the n⁺-type regions 119 discontinuously aligned.

[Tenth Embodiment]

Figure 11:
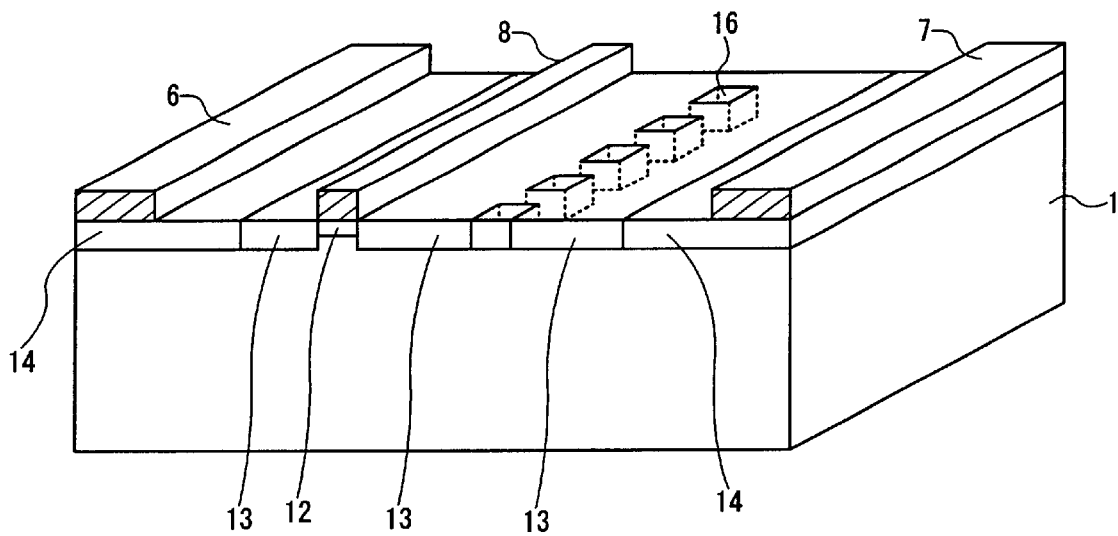
FIG. 11 is a cross-sectional and perspective view of a tenth embodiment of the present invention.

FIG. 11 is a cross-sectional and perspective view of a MESFET according to a tenth embodiment of the present invention, which has n⁻-type regions 16 discontinuously aligned in the gate-width direction. In other words, the structure shown in FIG. 11 can be obtained by replacing the n⁺-type regions 15 by the n⁻-type regions 16. The depletion layer is liable to be spread with respect to the discontinuously arranged the n⁻-type regions 16. It is possible to improve the breakdown voltage by adjusting the dose and acceleration energy of impurity ions acting to relax the concentration of the electric field so that the depletion layer reaches the bottom of the n⁻-type lightly-doped regions 13. In contrast, it is possible to reduce the ON resistance by forming the depletion layer so as not to reach the bottom of the n⁻-type lightly-doped regions 13.

Figure 12:
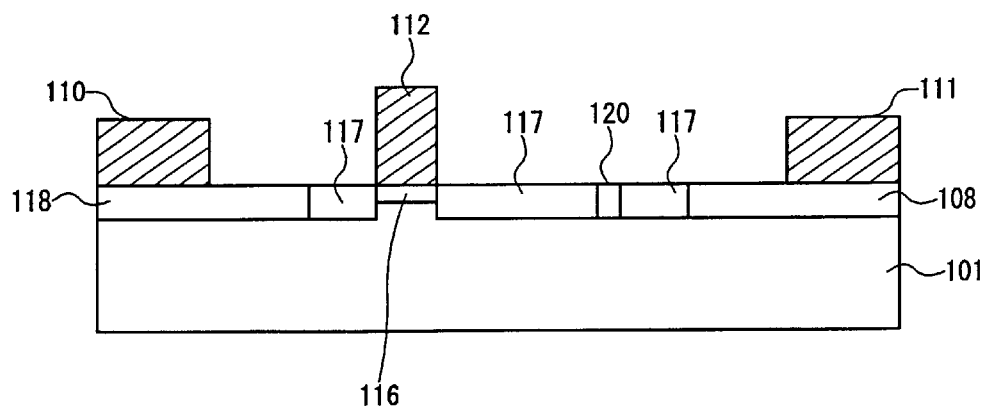
FIG. 12 is a cross-sectional view of the tenth embodiment of the present invention.

FIG. 12 is a cross-sectional view of the MESFET according to the tenth embodiment of the present invention. A description will be given, with reference to FIG. 12 of a method of fabricating the MESFET.

The process up to the formation of the gate electrode 8 is the same as that used in the ninth embodiment of the present invention. Next, ion implantation is performed from a region having a comparatively low impurity concentration to a region having a comparatively high impurity concentration. First, by using the lithographic process, the active regions are exposed, and Si ions are implanted (60 KeV, $5\times10^{12}$ cm$^{-2}$) so that the impurity particles to be injected in the n-type regions 120 arranged discontinuously are injected into the entire surfaces of the active regions. Next, the regions other than a region in which the n⁻-type regions 120 are to be formed are opened by using the lithographic process. Then, Si ions are implanted (60 KeV, $5\times10^{12}$ cm$^{-2}$) so that lightly-doped regions 117 are formed. Thereafter, by using the lithographic process, a region in which the ohmic n⁺-type source/drain regions 118 are to be formed is opened. Then, Si ions are implanted (60 KeV, $2\times10^{13}$ cm$^{-2}$), so that ohmic n⁺-type (highly-doped) source/drain regions 118 can be formed. The subsequent thermal treatment and the step of forming the ohmic electrodes are the same as those used in the ninth embodiment of the present invention.

The MESFET thus fabricated has an exemplary specification as described below. The gate electrode 112 is 0.5 μm long, and the interval between the gate electrode 112 and the discontinuous alignment of the n⁻-type regions 120 is 0.4 μm. The n⁻-type regions 120 are aligned at an interval of 0.4 μm. In this case, the MESFET has a small-signal gain of 14.5 dB at a frequency of 10 GHz, and a breakdown voltage of 12 V. Another MESFET which is fabricated in the same manner as described above and which does not have the n⁻-type regions 120 has a small-signal gain of 16 dB and a breakdown voltage of 7 V. Yet another MESFET which is fabricated in the same manner as described above and which has a continuous n⁻-type region has a small-signal gain of 13 dB at the same frequency as described above and a breakdown voltage of 12 V. It can be seen from the above that the MESFET employing the n⁻-type regions 120 discontinuously arranged in line has an improved breakdown voltage without greatly decreasing the gain. It is advantageous to form the above-mentioned depletion layer modulating mechanism or means in the position in which the second gate electrode of the conventional dual-gate structure is located.

Alternatively, the above-mentioned condition for ion implantation may be modified as follows. The Si ions may be implanted in the active regions at 60 KeV and $3\times10^{12}$cm$^{-2}$, and in the regions other than the n⁻-type regions 120 arranged discontinuously at 60 KeV and $3\times10^{12}$cm$^{-2}$.

The MESFET thus fabricated has an exemplary specification as described below. The gate electrode 112 is 0.5 μm long, and the interval between the gate electrode 112 and the discontinuous alignment of the n⁻-type regions 120 is 0.4 μm. The n⁻-type regions 120 are aligned at an interval of 0.4 μm. In this case, the MESFET has a small-signal gain of 14 dB at a frequency of 10 GHz, and a breakdown voltage of 14 V. Another MESFET which is fabricated in the same manner as described above and which does not have the n⁻-type regions 120 has a small-signal gain of 16 dB and a breakdown voltage of 7 V. Yet another MESFET which is fabricated in the same manner as described above and which has a continuous n⁻-type region has a small-signal gain of 12 dB at the same frequency as described above and a breakdown voltage of 14 V. It can be seen from the above that the MESFET fabricated under the condition for ion implantation modified as described above has a further improved breakdown voltage. Anyway, the two methods of fabricating the MESFET according to the tenth embodiment of the present invention make it possible to improve the breakdown voltage without greatly reducing the gain.

[Eleventh Embodiment]

FIG. 13 is a cross-sectional and perspective view of a HEMT according to an eleventh embodiment of the present invention. A continuous cap layer 20 is substituted for the second gate electrode in the dual-gate type HEMT. The continuous cap layer 20 continuously extends in the gate-width direction and is isolated from the gate electrode 8. The continuous cap layer 20 can be defined in such a manner that the corresponding portion of the gap layer 5 remains in the patterning process. The continuous gap layer 20 acts to relax the electric field in the depletion layer. The cap layer 5 is a low-resistance layer of n⁺-type for making ohmic contacts of the source electrode 6 and the drain electrode 7 with the semiconductor surface. The cap layer 5 is formed on the entire semiconductor surface before patterning. Then, by using the lithographic process, the cap layer 5 formed on the entire surface is patterned so that the n⁺-type continuous cap layer 20 can be defined. The other fabrication processes are the same as those for the HEMT according to the third embodiment of the present invention.

Generally, there is a surface depletion layer on the semiconductor surface between the gate electrode and the drain electrode. When a low-resistance layer of n⁺-type is provided on the semiconductor surface, the surface depletion layer at the interface falls back to the inner surface of the n⁺-type layer, so that the surface depletion layer is divided into parts on the original semiconductor surface. Such a modulation of the surface depletion layer influences electrons going straightforwardly from the drain to the gate, and thus makes it difficult to cause Avalanche breakdown at the end of the gate electrode. The ON resistance is not affected because the depletion layer cannot spread to the channel layer as in the conventional dual-gate structure. A semiconductor layer or a conducting layer that is conductible with respect to the semiconductor surface which contacts the above-mentioned continuous pattern is effective to modulation of the surface depletion layer as described above. The "conductible" means that, even when there is a potential barrier at the interface because of the hetero junction or Schottky junction or a difference in impurity concentration, the carriers can freely pass through the junction as in the case of the ohmic contacts for the reason that the potential barrier has a height as high as carriers having thermal energy can go over the barrier or has a high as thin as a sufficient amount of tunnel current flows therethrough.

[Twelfth Embodiment]

A MESFET according to a twelfth embodiment of the present invention has a structure in which n⁻-type regions 16 discontinuously aligned as shown in FIG. 11 are replaced by p-type regions. Thus, such p-type regions are formed in the n-type semiconductor region (n⁻-type source/drain region 13) and are aligned intermittently in the gate-width direction. The depletion layers extend along the pn junctions thus defined, so that the concentration of electric field can be relaxed. It is also possible to control the spreading of the depletion layers by externally applying a bias to the device.

According to the present invention, the depletion layer modulating means is newly provided between the gate and the drain in addition to the depletion layer extending from the gate electrode in order to improve the breakdown voltage between the gate and the drain, so that the concentration of electric field in the vicinity of the depletion layer extending from the gate electrode can be relaxed. The new (second) depletion layer modulating means is arranged so that new depletion layers thus formed are discontinuous in the gate width direction of the gate electrode.

The depletion layers thus formed discontinuously can reduce the gate capacitance and the ON resistance. Examples of the depletion layer modulating means are as follows. The first modulation means includes semiconductor portions that are conductible with respect to the semiconductor surface, such as the discontinuous cap layers. The second modulation means includes the second recesses that are arranged discontinuously and extend from the gate recess surface in the depth direction. The third modulation means includes discontinuously arranged regions of n⁺-type or n⁻-type having a different impurity concentration. The fourth modulation means includes p-type impurity implanted regions arranged discontinuously.

In the ON state, any of the above-mentioned structures causes a voltage drop and thus reduces the voltage drop developing caused at the drain side of the gate electrode. Thus, the concentration of electric field in the vicinity of the gate electrode can be relaxed. In the OFF state, any of the above-mentioned structures functions as an obstacle with respect to a leakage current traveling in the surface depletion layer, so that kinetic energy at the time when the carriers reach the drain side of the gate electrode can be prevented from exceeding the critical energy for impact ionization. In order to influence the current paths on the drain side of the gate electrode, it is necessary for the new or additional depletion layers created by the depletion layer modulating means not to be completely unified with the depletion layer extending from the gate electrode.

It is also possible to electrically connect the discontinuous portions of the depletion layer modulating means and drive the discontinuous portions thus connected mutually by means of an independent voltage supply source, so that the degree of modulation of the depletion layers can be controlled. If it is requested to greatly control the overall depletion layers by a small change in the gate bias, the gate electrode is connected to the independent voltage supply source. If it is requested to maintain the depletion layers at a fixed state, the voltage supply source is set in a floating state. If it is requested to use different biasing conditions dependent to different applications, pads are formed on the semiconductor chip so that voltages can be applied to the gate and the discontinuous portions independently. When the voltage applied to the discontinuous portions of the depletion modulating means is set lower than the gate voltage, the semiconductor devices having the particularly improved breakdown voltage can be realized. In the case where the discontinuous portions are formed of part of the gap layer, the discontinuous portions are as high as the gap layer or is lower than the gap layer. Such a selection of the height of the discontinuous portions depend on the size and application of the device. If the gate-drain distance is relatively long or the operating frequency is not high, the discontinuous portions are made as high as the gap layer in order to give priority to improvement in the breakdown voltage. If the gate-drain distance is relatively short or the operating frequency is high, the discontinuous portions are made lower than the gap portion in order to prevent an increase in capacitance.

The dose of impurity for the formation of $n^+$-type regions is selected in the same manner as described above. When it is requested to give priority to improvement in the breakdown voltage, the same dose as that for the formation of the ohmic regions is selected. If priority to improvement in capacitance is given, a lower dose is selected.

In the case of the second recesses, if it is required to give priority to improvement in the breakdown voltage, control is performed so that no carriers exist below the second recesses with no bias being applied thereto. If it is required to give priority to improvement in the ON resistance with the bias being applied thereto, control is performed so that carriers exist below the second recesses.

In the case of use of $n^-$-type regions, control is performed so that no carriers exist below the $n^-$-type regions with no bias being applied thereto. If it is required to give priority to improvement in the ON resistance with the bias being applied thereto, control is performed so that carriers exist below the $n^-$-type regions.

The present invention is not limited to the specifically disclosed embodiments, and variations and modifications may be made without departing from the scope of the present invention. For example, the material and size of each layer, doping concentration, condition for addition of an impurity, and the fabrication processes are not limited to those specifically described.

What is claimed is:

1. A semiconductor device comprising:
    a semiconductor layer structure;
    gate, drain and source electrode being provided on the semiconductor layer structure, the gate electrode being located between the drain and source electrodes; and
    a depletion modulating part that is located between the gate electrode and the drain electrode and includes portions spaced apart from each other in a gate-width direction, wherein:
        the portions of the depletion layer modulating part are made of a conducting material; and
        the depletion layer modulating part further comprises another portion which electrically connects the portions thereof.

2. The semiconductor device as claimed in claim 1, wherein the semiconductor device includes a field effect transistor including the gate, source and drain electrodes and the depletion layer modulating part.

* * * * *